United States Patent
McLain et al.

(10) Patent No.: US 7,430,729 B2
(45) Date of Patent: Sep. 30, 2008

(54) DESIGN RULE REPORT UTILITY

(75) Inventors: Michelle A. McLain, Norcross, GA (US); Robert D. Kreisinger, Suwanee, GA (US); Albert D. Peterson, Lawrenceville, GA (US)

(73) Assignee: Motorola, Inc., Schaumburg, IL (US)

( * ) Notice: Subject to any disclaimer, the term of this patent is extended or adjusted under 35 U.S.C. 154(b) by 394 days.

(21) Appl. No.: 11/081,447

(22) Filed: Mar. 16, 2005

(65) Prior Publication Data

US 2006/0218516 A1 Sep. 28, 2006

(51) Int. Cl.
G06F 17/50 (2006.01)
G09G 5/00 (2006.01)

(52) U.S. Cl. ............... 716/10; 716/4; 345/650

(58) Field of Classification Search ....... 716/4, 716/5, 10; 345/650
See application file for complete search history.

(56) References Cited

U.S. PATENT DOCUMENTS

| | | | |
|---|---|---|---|
| 5,572,639 A | 11/1996 | Gantt | |
| 5,828,580 A | 10/1998 | Ho | |
| 5,875,115 A | 2/1999 | Weber | |
| 6,516,450 B1 * | 2/2003 | Hill et al. | 716/4 |
| 2003/0037308 A1 * | 2/2003 | Tsukuda | 716/11 |
| 2003/0131333 A1 * | 7/2003 | Rutenbar et al. | 716/11 |

* cited by examiner

Primary Examiner—Stacy Whitmore
Assistant Examiner—Magid Y. Dimyan
(74) Attorney, Agent, or Firm—Phillip H. Burrus, IV; David Watanabe; Anthony P. Curtis

(57) ABSTRACT

This invention provides a graphical tool by which a person may quickly and efficiently check the relational information between elements of a computer model. The invention may be used to quickly validate the design rules, like minimum spacing requirements between the connections (or nets) in a schematic that exists in a computer aided design package. Since a designer must enter such design rules for each net, the invention first imports these design rules from the computer model and then imports a standard set of design rules. After comparing both the sets of design rules, the invention presents a graphical display (a matrix) to a user indicating where the model rules matched the standard set and, correspondingly, where they did not match.

17 Claims, 10 Drawing Sheets

| | CONDITIONAL RULE SPACING LEVELS | 801 | 802 | 803 |
|---|---|---|---|---|
| # | CLEARANCE POINTS | FR4 | S1 | S2 |
| 1 | TRACK_TO_TRACK  808 | 0.2 | 0.25 | 0.7 |
| 2 | VIA_TO_TRACK  809 | 0.2 | 0.25 | 0.7 |
| 3 | VIA_TO_VIA  810 | 0.2 | 0.25 | 0.7 |
| 4 | PAD_TO_TRACK  811 | 0.25 | 0.49 | 0.9 |
| 5 | PAD_TO_VIA  812 | 0.25 | 0.49 | 0.9 |
| 6 | PAD_TO_PAD  813 | 0.4 | 0.85 | 1.4 |
| 7 | SMD_TO_TRACK  814 | 0.3 | 0.75 | 0.95 |
| 8 | SMD_TO_VIA  815 | 0.45 | 0.75 | 0.95 |
| 9 | SMD_TO_PAD  816 | 0.45 | 0.95 | 1.5 |
| 10 | SMD_TO_SMD  817 | 0.45 | 0.95 | 1.5 |
| 11 | COPPER_TO_TRACK  818 | 0.25 | 0.3 | 0.5 |
| 12 | COPPER_TO_VIA  819 | 0.25 | 0.3 | 0.5 |
| 13 | COPPER_TO_PAD  820 | 0.3 | 0.55 | 0.95 |
| 14 | COPPER_TO_SMD  821 | 0.3 | 0.55 | 0.75 |
| 15 | DRILL_TO_TRACK  822 | 0.35 | 0.4 | 0.8 |
| 16 | DRILL_TO_VIA  823 | 0.35 | 0.4 | 0.8 |
| 17 | DRILL_TO_PAD  824 | 0.35 | 0.4 | 0.8 |
| 18 | DRILL_TO_SMD  825 | 0.35 | 0.4 | 0.8 |
| 19 | DRILL_TO_COPPER  826 | 0.35 | 0.4 | 0.8 |

*FIG. 8A*

| # | DEFAULT/NET RULE SPACING LEVELS | FR4 | S1 | S2 |
|---|---|---|---|---|
| 1 | TRACK_TO_TRACK | 0.2 | 0.25 | 0.7 |
| 2 | VIA_TO_TRACK | 0.2 | 0.25 | 0.7 |
| 3 | VIA_TO_VIA | 0.2 | 0.25 | 0.7 |
| 4 | PAD_TO_TRACK | 0.25 | 0.49 | 0.9 |
| 5 | PAD_TO_VIA | 0.25 | 0.49 | 0.9 |
| 6 | PAD_TO_PAD | 0.4 | 0.85 | 1.4 |
| 7 | SMD_TO_TRACK | 0.3 | 0.75 | 0.95 |
| 8 | SMD_TO_VIA | 0.45 | 0.75 | 0.95 |
| 9 | SMD_TO_PAD | 0.45 | 0.95 | 1.5 |
| 10 | SMD_TO_SMD | 0.45 | 0.95 | 1.5 |
| 11 | COPPER_TO_TRACK | 0.25 | 0.3 | 0.5 |
| 12 | COPPER_TO_VIA | 0.25 | 0.3 | 0.5 |
| 13 | COPPER_TO_PAD | 0.3 | 0.55 | 0.95 |
| 14 | COPPER_TO_SMD | 0.3 | 0.55 | 0.75 |
| 15 | TEXT_TO_TRACK | 0.15 | 0.15 | 0.15 |
| 16 | TEXT_TO_VIA | 0.15 | 0.15 | 0.15 |
| 17 | TEXT_TO_PAD | 0.15 | 0.15 | 0.15 |
| 18 | TEXT_TO_SMD | 0.15 | 0.15 | 0.15 |
| 19 | OUTLINE_TO_TRACK | 0.3 | 0.3 | 0.3 |
| 20 | OUTLINE_TO_VIA | 0.3 | 0.3 | 0.3 |
| 21 | OUTLINE_TO_PAD | 0.3 | 0.3 | 0.3 |
| 22 | OUTLINE_TO_SMD | 0.3 | 0.3 | 0.3 |
| 23 | DRILL_TO_TRACK | 0.35 | 0.4 | 0.8 |
| 24 | DRILL_TO_VIA | 0.35 | 0.4 | 0.8 |
| 25 | DRILL_TO_PAD | 0.35 | 0.4 | 0.8 |
| 26 | DRILL_TO_SMD | 0.35 | 0.4 | 0.8 |
| 27 | DRILL_TO_COPPER | 0.35 | 0.4 | 0.8 |
| 28 | SAME_NET_SMD_TO_VIA | 0.1 | 0.1 | 0.1 |
| 29 | SAME_NET_SMD_TO_CRN | 0.1 | 0.1 | 0.1 |
| 30 | SAME_NET_VIA_TO_VIA | 0.1 | 0.1 | 0.1 |
| 31 | SAME_NET_PAD_TO_CRN | 0.1 | 0.1 | 0.1 |
| 32 | MIN_TRACK_WIDTH | 0.15 | 0.15 | 0.15 |
| 33 | REC_TRACK_WIDTH | 0.25 | 0.25 | 0.25 |
| 34 | MAX_TRACK_WIDTH | 0.25 | 0.25 | 0.25 |
| 35 | DRILL_TO_DRILL | 0.35 | 0.35 | 0.35 |
| 36 | BODY_TO_BODY | 0.1 | 0.1 | 0.1 |
| 37 | SAME_NET_TRACK_TO_CRN | 0.1 | 0.1 | 0.1 |

*FIG. 8B*

DESIGN RULE SAFETY MATRIX CREATION REPORT

FILE IMPORTED: D:\MICHELLE'S STUFF\INNOVATION\DR_MATRIX\EXAMPLES\CHEMATIC6NETS.TXT

CONDITIONAL OR NET RULES SUCCESSFULLY IMPORTED: 7

CONDITIONAL OR NET RULES WITH CLEARANCE MISMATCH ERRORS: 1

DEFAULT CLEARANCE LEVEL: FR4

CLEARANCE MISMATCH ERROR DETAILS

901 — ERROR IN RULE FOR NET1 & NET2.

901 — FOR LEVEL S1, PARAMETER VIA_TO_VIA WAS 0.2MM IN SCHEMATIC AND SHOULD BE 0.25MM.

DESIGN RULE REPORT UTILITY

BACKGROUND

1. Technical Field

This invention relates generally to a software tool for rapidly checking design rules associated with an apparatus or computer model, and more specifically to software that compares relational data of an apparatus or software model to a set of predetermined design rules and graphically presents to a user a matrix that indicates where the relational data does and does not correspond to those design rules.

2. Background Art

Most all electronic devices include a printed circuit board somewhere in the device. The printed circuit board serves as the "brain" of the device, as this is where all of the electronic "magic" happens. Microprocessors, memory devices, transistors, resistors and capacitors are all connected together on the printed circuit board. In short, in an electronic device, a printed circuit board is where all the action takes place.

Not so long ago, engineers designed printed circuit boards using tape and cardboard. Starting with a paper schematic diagram, an engineer would meticulously affix tape to the cardboard. The tape would indicate where the electrical conductors, or "traces", should go. The engineer would then draw or tape in other elements like pads, component locations and holes. A camera would take a picture of the finished "board" and that image would be used by the board manufacturer to etch the real circuit board in miniature form.

Every circuit board has certain design rules associated with electrical components. These design rules may cover any number of limitations related to the circuit. By way of example, since electricity is capable of arcing from one conductor to the next, one type of design rule relates to the spacing between conductors and components. For instance, a minimum spacing between conductors on a printed circuit board may be 0.5 mm.

Back in the day where tape was used to create circuit boards, engineers had to manually measure the distance between circuit components with a ruler. Today, however, tape and cardboard are no longer used in designing circuit boards. Computer aided design tools have automated the entire printed circuit board design process. Both the schematic and corresponding printed circuit board may be created entirely with a computer.

Using computer aided design tools, an engineer first draws the circuit in a schematic capture program. When the schematic is first entered, the engineer can manually enter design rules associated with each component. By way of example, when the engineer connects a resistor to a battery, the engineer has just created a nodal connection, or "net", to which design rules may be assigned. That net may not be allowed to be any closer than 2 mm, for example, to any other component.

From this schematic, a printed circuit board computer aided design system creates a parts list, with each part corresponding to a schematic symbol. A circuit board designer then takes the parts list and, with the aid of a computer mouse, drags the parts onto a virtual circuit board. The computer aided design program reads the design rules from the schematic and may associate the rules with elements like parts, pins, pads, holes and traces on the circuit board. Additionally, depending upon the features and settings of the program, the computer aided design program may automatically create "keep outs" that prevent the designer from putting components too close together.

The problem with this system is that the engineers who enter the design rules are human. Consequently, they are prone to make typographical errors when entering the design rules. For instance, the engineer may enter a spacing of 0.4 mm as opposed to 0.5 mm. The result may be a circuit that stops operating if coffee or another liquid comes into contact with the printed circuit board.

One prior art solution intended to prevent this data entry problem is the textual design rule report. The manufacturers of schematic capture programs have developed software that will export a text file listing every electrical connection, or net, and the design rules associated therewith. The engineer can check the design rules by reading the nets one by one and checking them by hand to ensure that they are correct. This is incredibly time consuming, however, as such a text file can exceed one hundred pages for even the simplest schematic. With typical design cycles running less than six weeks, there is simply not enough time to read and hand check hundreds and hundreds of pages of textual data.

There is thus a need for an improved method of checking design rules associated with electronic models.

BRIEF DESCRIPTION OF THE DRAWINGS

FIG. 8 illustrates one preferred embodiment of a design rule data set in accordance with the invention.

FIG. 9 illustrates one preferred embodiment of a rule import report associated with software for checking design rules associated with an electronic model in accordance with the invention.

DETAILED DESCRIPTION OF THE INVENTION

Figure 1:
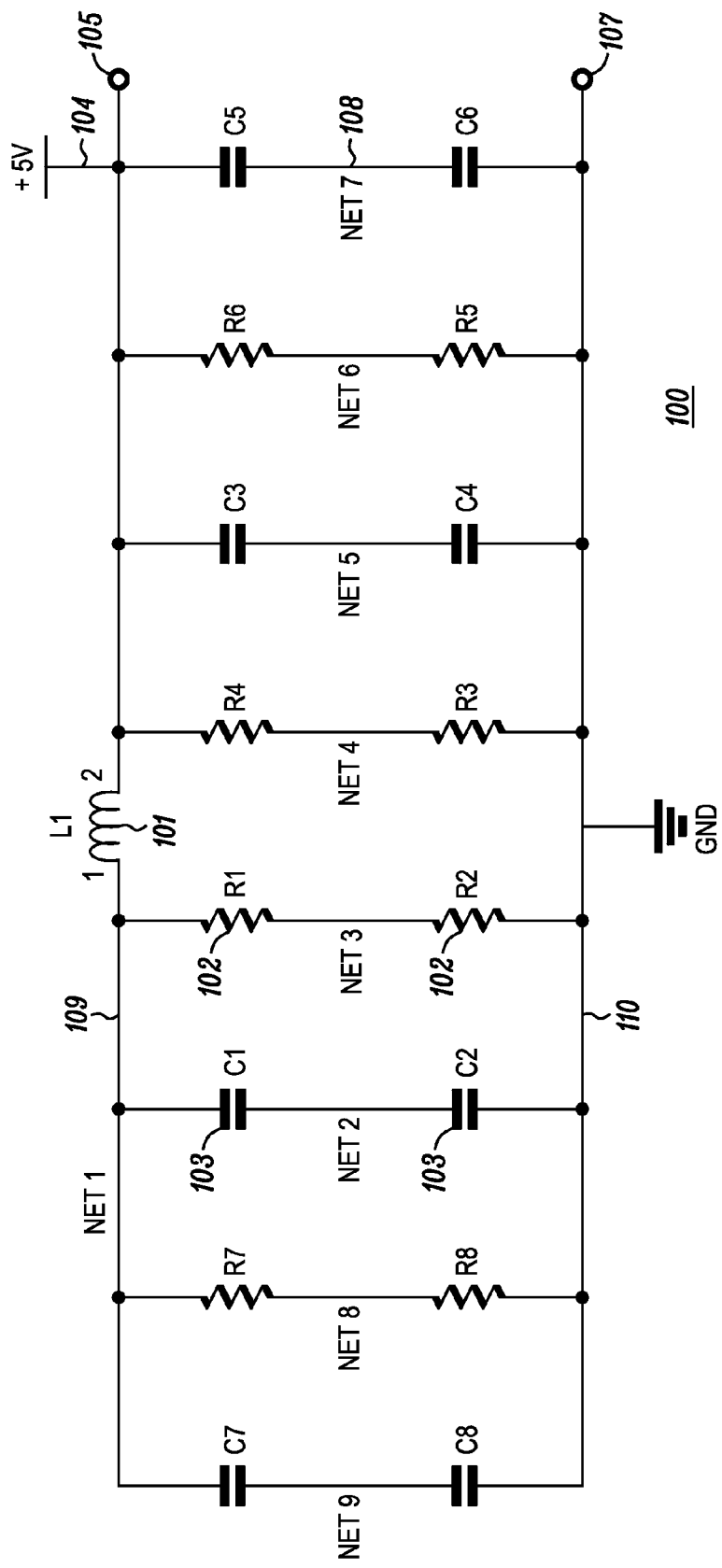
FIG. 1 illustrates one example of a schematic diagram of an electrical circuit.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

In its simplest embodiment, this invention includes a method for graphically displaying relational information between sets of data elements that correspond to an electronic model. For example, using an electrical circuit computer aided design package for schematic capture and printed circuit board layout, the invention imports design rules from a schematic capture program. The design rules may relate to, for example, a series of electrical connections or nets. These design rules are then displayed as a matrix for easy validation and verification. The invention, which may be software running on a computer, populates the matrix with the design rules according to specified rule sets to ensure that the design rules have been entered properly. The invention gives the user a quick, efficient, and simple way to verify that the design rules have been entered properly into the computer aided design package.

Stated slightly differently, a method for displaying relational information between data elements from an electronic model is provided. The method includes displaying a graphical matrix grid, populating at least one column of the matrix with data elements from the model, and populating at least one row of the matrix grid with data elements from the model. The invention then displays relational information between the data elements in the row and the data elements in the column as coefficients that correspond to a data element of the column and a data element of the row. The relational information coefficient is displayed at a point in the matrix where the particular row and column intersect.

The operation of the invention is best explained by way of example. For discussion purposes, a schematic capture and printed circuit board computer aided design system will be used as an exemplary application for the invention. It will be clear to those of ordinary skill in the art having the benefit of this disclosure, however, that the invention is not so limited. The invention could equally be applied to any system where an electronic model having design rules, constraints, or associated criteria is used.

Turning now to FIG. 1 illustrated therein is a simple schematic of an electrical circuit that will be used herein for a basic description of the operation of the invention. The simple schematic 100 of FIG. 1 includes electrical components like an inductor 101, resistors 102, capacitors 103, power source 104, and a plurality of external terminals 105,107. These elements are connected by conductors or wires, for example at node 108, node 109 and node 110. These electrical connections or nodes are often referred to as "nets" in the world of schematic creation and printed circuit board design. In the schematic of FIG. 1, several of the nets have been labeled, e.g. NET1, NET2, NET3 and so forth.

Using a schematic capture tool available on the market, an engineer might enter the schematic by dragging the various components from a menu onto a blank screen. The various components would then be connected with virtual wires to form the schematic. Once the schematic is completed, various constraints and design rules may be entered. These design rules can correspond to various circuit elements or nets.

Figure 4:
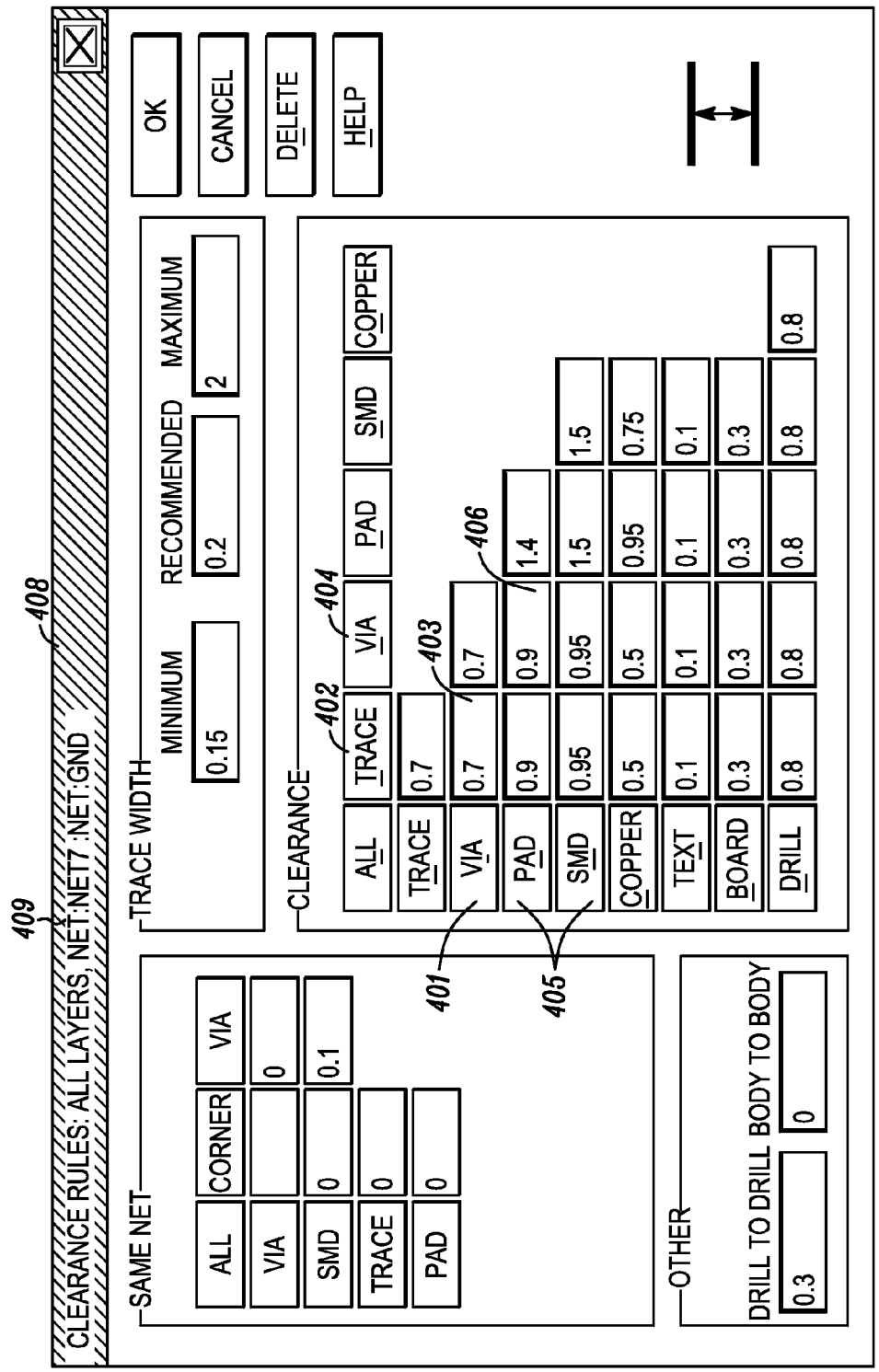
FIG. 4 illustrates an exemplary embodiment of a design rule graphical user interface for entering design rules in a schematic.

Turning briefly to FIG. 4, illustrated therein is one example of a design rule entry window 400 that may be included in a schematic capture computer aided design program. In this window 400, various design rules may be entered that correspond to nets of the schematic of FIG. 1. For example, button 401 and button 402 illustrate fields in a column and row, respectively, of a matrix of this design entry window. Button 401 corresponds to a design rule relating to vias, while button 402 corresponds to a design rule relating to traces, both of which relate to two nets in the circuit net NET7 409 and net GND 408. NET7 409 corresponds to node 108 of FIG. 1, while net GND 408 corresponds to node 110 of FIG. 1.

At window 403, the user is able to enter a spacing design rule corresponding to the spacing between vias and traces in the schematic. For example, in the illustrative embodiment of FIG. 4, this design rule has been set at 0.7 in window 403. This design rule means that for NET7 409 and GND 408, the minimum spacing between vias and traces is 0.7 mm. One sees this since the "0.7" is in window 403, which is at the intersection of button 401 and button 402.

Similarly, for these nets, the minimum spacing between pads and vias is 0.9 mm as is noted in window 406. It can be seen that this is the minimum spacing because window 406 is shown at the intersection of the row containing button 405 and the column containing button 404. Thus, as shown, an engineer may enter the various design rules in this window when the design is schematic. After entering all of the design rules, the computer aided design package automatically associates the design rules with the various nets of the schematics.

Figure 2:
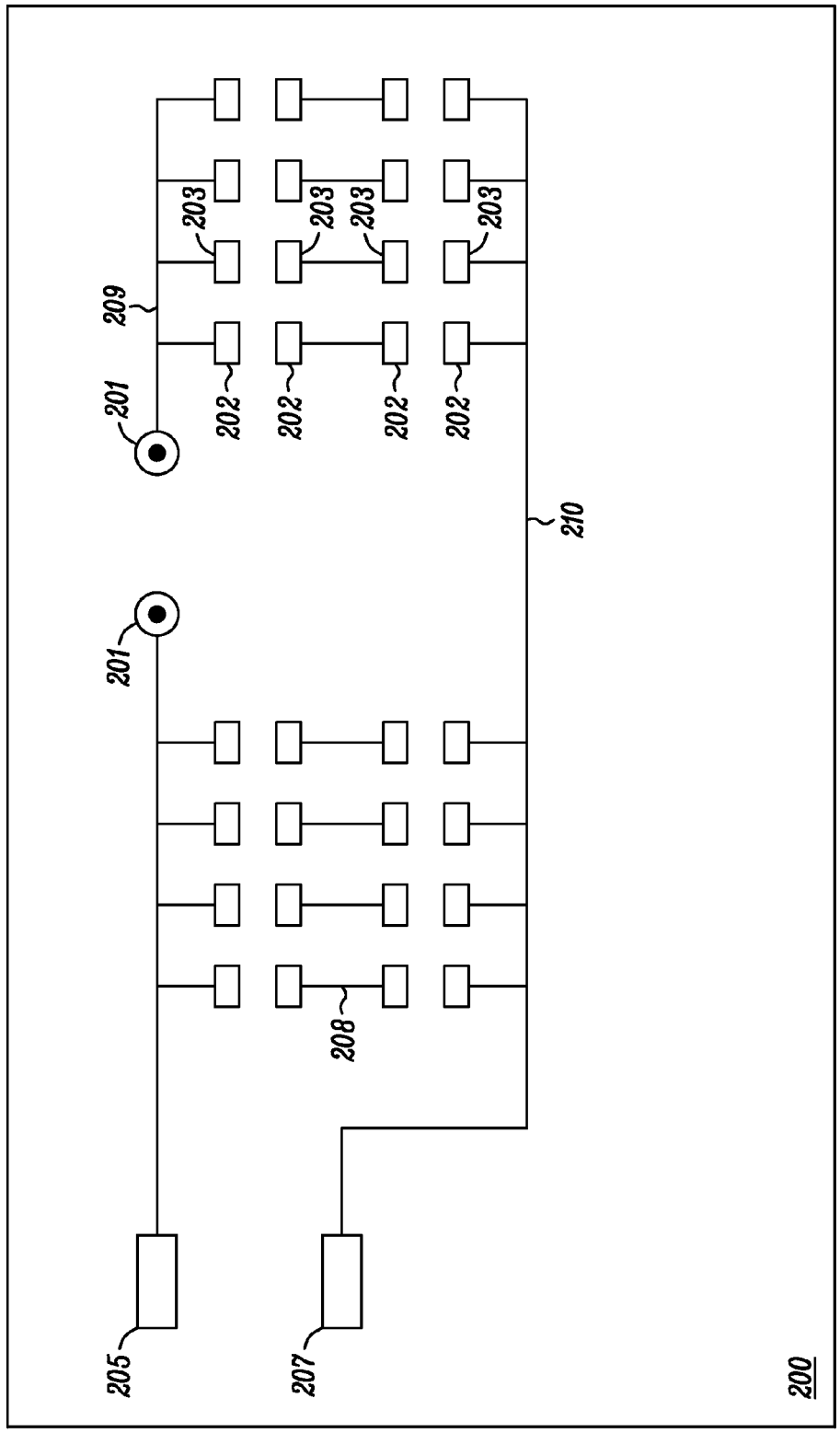
FIG. 2 illustrates one embodiment of a printed wiring board for the schematic of FIG. 1.

Turning now to FIG. 2, illustrated therein is an exemplary printed wiring board that may be laid out in a computer aided design program for the schematic circuit of FIG. 1. The printed wiring board 200 is given that name because in the embodiment of FIG. 2, no electronic components have been populated on the board. A "printed wiring board" becomes a "printed circuit board" once electrical components have been populated thereon. The printed wiring board 200 of FIG. 2 includes plated vias 201 for coupling to the inductor. Similarly, conductive pads 202 are for coupling to resistors, while pads 203 may be populated with capacitors. Exposed pads 205, 207 are the external terminals from the schematic of FIG. 1. Electrical conductors 208, 209 and 210 link the various pads together, and correspond to the nets or nodes 108, 109 and 110 of the schematic in FIG. 1.

Figure 3:
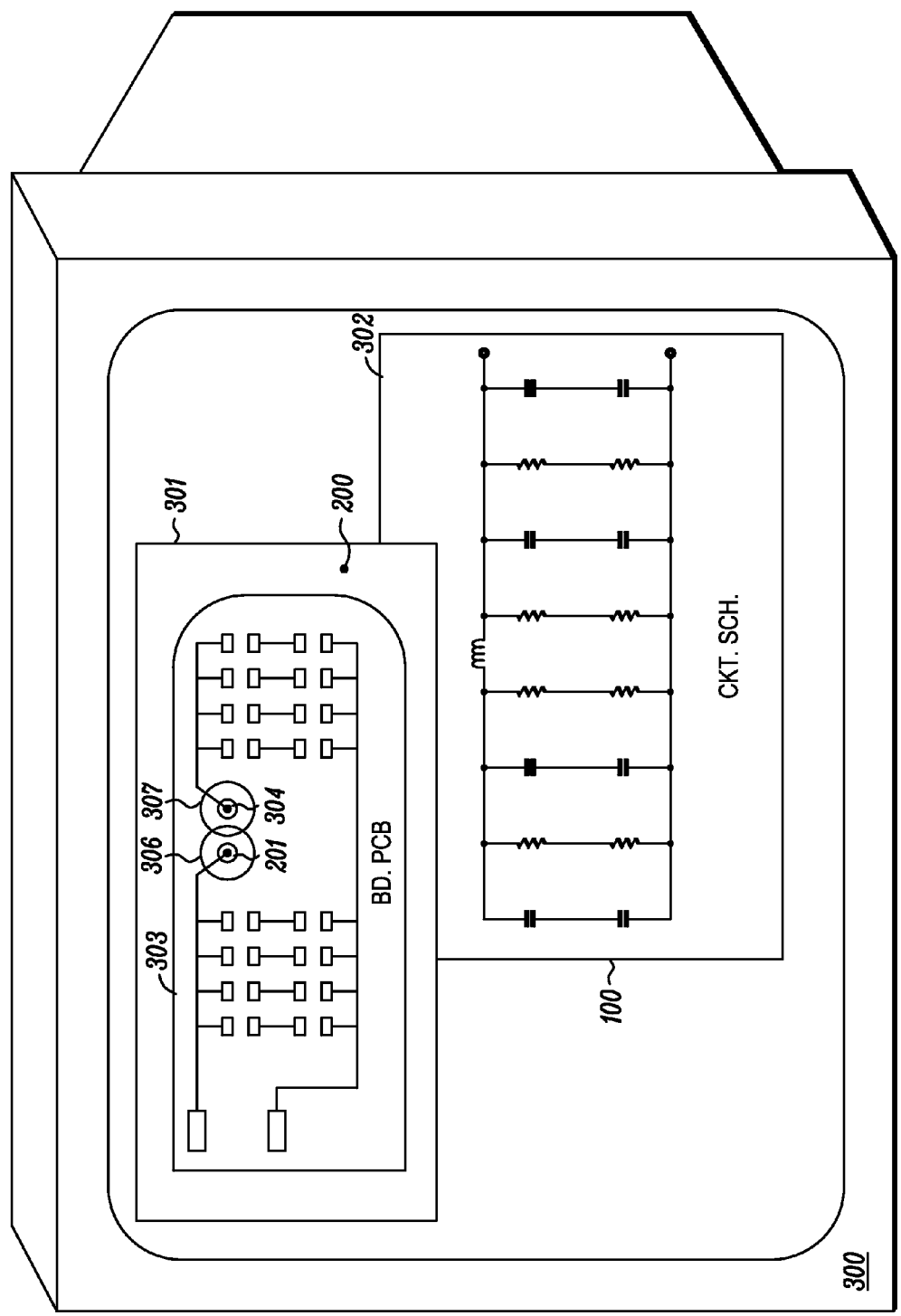
FIG. 3 illustrates an exemplary view of a computer aided design program for schematic capture and printed circuit board layout.

Turning now to FIG. 3, illustrated therein is what a printed circuit board designer may see on a computer monitor 300 when designing a printed circuit board from the schematic of FIG. 1. Shown in FIG. 3 are two windows 301, 302 that are open in the computer aided design package. The first window 301 shows a virtual circuit board 303 that the printed circuit board designer is constructing. The second window 302 is of the schematic 100 that was illustrated in FIG. 1.

As noted above, when the engineer entered the schematic 100, he or she was also able to enter design rules associated with the components and nets in the schematics. While there are many types of design rules, as noted above one exemplary type that will be used herein for the purposes of discussion is that of minimum spacing distance. These types of design rules are used to ensure that components, traces, vias and pads do not get too close together. As noted above, when the engineer enters these design rules with the schematic, the computer aided design package with the appropriate feature set may automatically associated minimum spacing distances, or "keep outs", within which no components may be populated. Such a keep out is shown as circle 306 which circles contact of plated via 201. No other vias may be populated within that circle 306. Note that the other plated via 304 is populated outside circle 306, while plated via 201 is populated outside keepout 307.

This system works well in that the computer aided design package will ensure that components are not populated within the keepouts. However, as noted above, if the engineer erroneously enters the design rule, catastrophic events may occur. For example, components may be placed too close together, which may result in arcing or solder bridges that will compromise the operation of the circuit. It is this problem for which the present invention provides a solution.

Prior to describing the operation of the invention in detail, it is necessary to understand some of the functionality of common schematic capture programs. Most available schematic capture computer aided design programs include text export capability where a text file listing information about the computer model may be printed out and viewed by a user.

Figure 5:
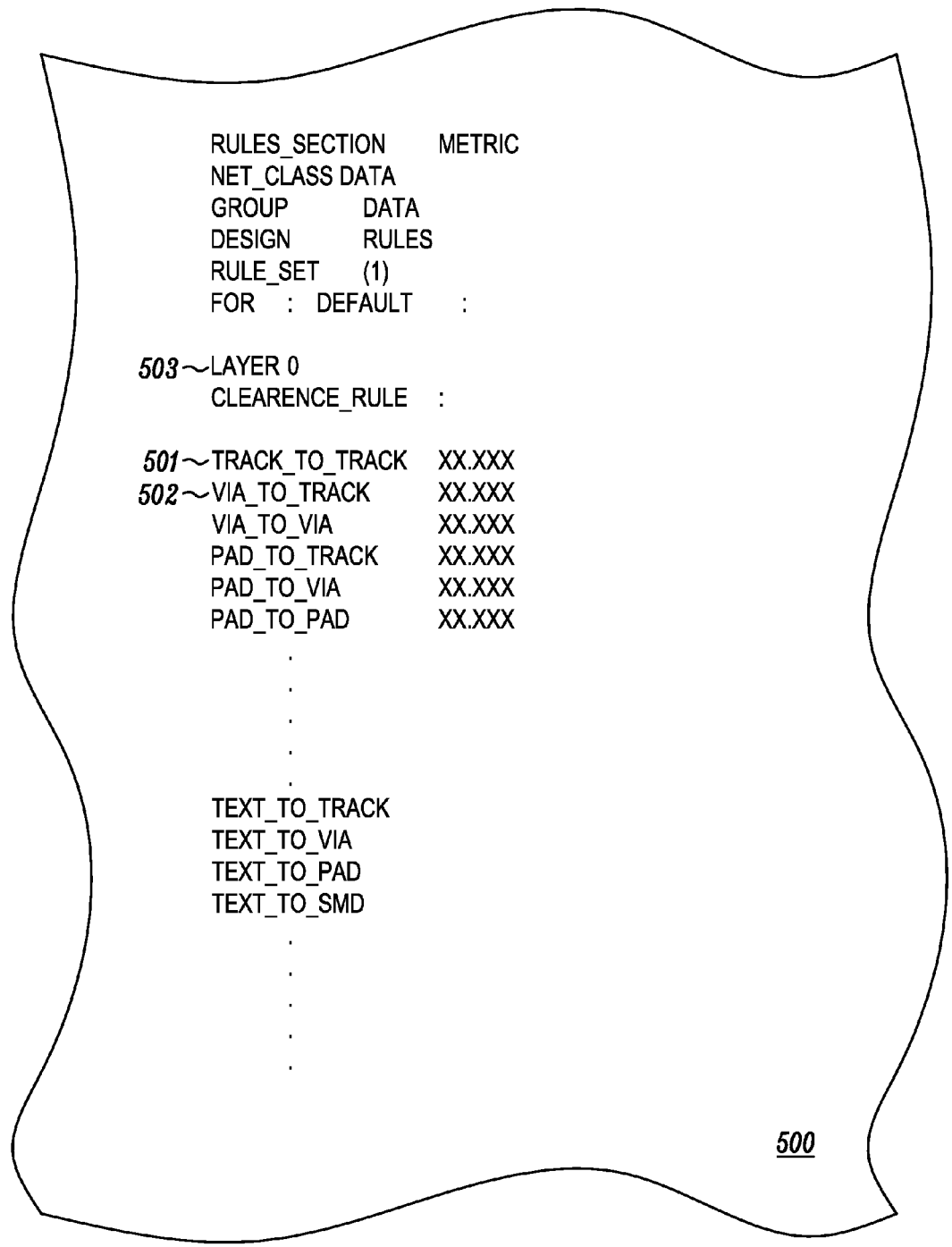
FIG. 5 illustrates an exemplary embodiment of a textual design rule printout from a schematic capture computer aided design program.

Turning now to FIG. 5, illustrated therein is one such text file that may be exported from a schematic capture program. Typically, these text files can be configured so as to export only the information desired by the user. For example, the text file 500 of FIG. 5 includes fundamental information about the various nets in the schematic.

As can be seen, the design rules are listed as various text lines within the file 500. For instance, the track to track default design rule is shown at line 501. Similarly, the via to track design default design rule is shown at line 502 of the text file. While an engineer might be able to manually read each of these design rules checking to make sure that the data entered was correct, for even the simplest schematic, these text files can be hundreds of pages or more. It is the object of this invention to take this text file and provide a convenient graphical representation that makes design rule checking easy for the user.

Figure 6:
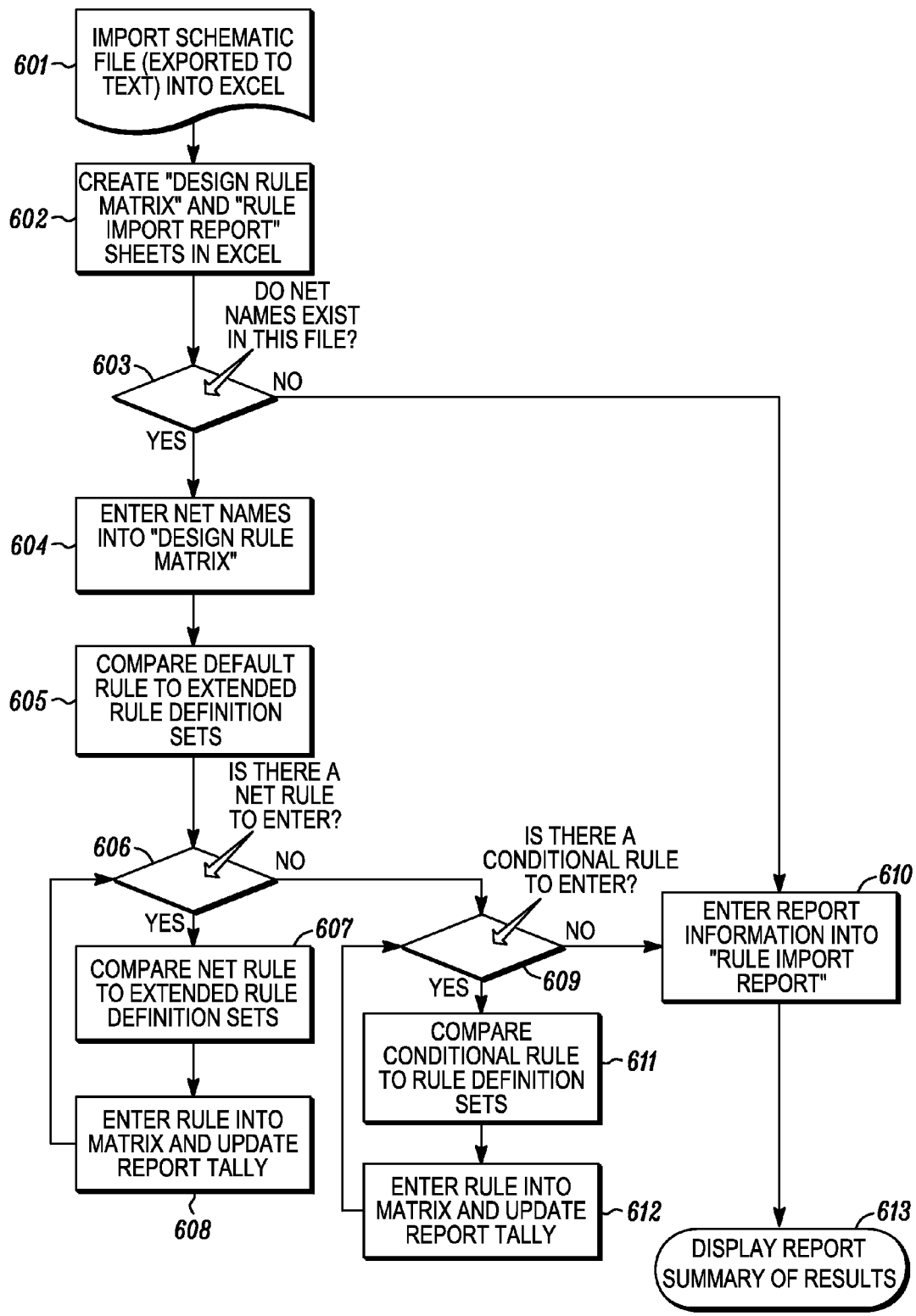
FIG. 6 illustrates one preferred embodiment of a method for displaying relational information between data elements and design rule elements in accordance with the invention.

FIG. 6 illustrates a method for graphically displaying relational information between groups of data elements associated with an electronic model. The simplest way to understand the operation of the method is by first examining an example. As such, continuing with the schematic capture and printed circuit board example started above, a practical example will be stepped through referring periodically to the blocks of FIG. 6. Other figures will be intermittently referred to as needed.

At step 601, the invention, which may be conveniently implemented as a computer program, imports the text file of FIG. 5. Recall that this file is the hundreds of pages of text listing the various design rules associated with the computer model, which is the schematic in the present example. This text file is imported and stored with the design rule data set being stored as a plurality of data elements associated with the model.

At step 602, the program creates the two graphical output displays. These displays, which are referred to herein as the "Design Rule Matrix" and "Rule Import Report", will be described in detail in the discussion of FIGS. 7 and 9. For the moment, simply understand that the Design Rule Matrix is a graphical grid with which design rules may be quickly checked, while the Rule Import Report is a listing of mismatches where the design rules entered into the system do not correspond to a standard design rule set.

At step 603, the program reads the text file (shown in FIG. 5) that was imported at step 601 to ensure that the design rule of choice, net names for this example, is present in the text file. Presuming for the moment that the net names and corresponding design rules are present, the program proceeds to step 604.

At step 604, the program reads all of the net names as data elements associated with the electronic model. The program then populates the matrix such that a set of data elements fills a row of the matrix grid, while another set of data elements fills a column of the matrix grid. In the case of a schematic, one might like to compare the design rules of all nets against all other nets. In this case, the program would list the nets in a column as the relevant data elements. The program may then list the same nets in a row as relevant data elements. In such a scenario, the data elements populating the index column and index row would be the same. Organization, for example alphabetization of the nets, may be employed to make both the row and column more easily readable.

At step 605, the default rule from the overall schematic (which is read from the text file imported at step 601) is compared to the predefined default rule sets. The results are reported to the "Rule Import Report" as a single line entry that indicates which default rule has been associated with the overall schematic. (This default rule will be assigned to any net to net relationship that has not been given a rule that supersedes the default rule.) To understand the default rule set, turn now to FIG. 8. As shown in FIG. 8, one component of the invention is a standard, or predefined, design rule set. As noted above, design rules may be any restriction, qualification or constraint given to the various elements of an electronic model. In the world of schematic capture, one such design rule is the minimum spacing about the various components or connections. It is this example that will be carried forward for the purposes of this discussion.

As noted above, the invention compares all entered design rules to a standard set of design rules to verify that they have been entered properly. Thus, a standard set of design rules is required for this comparison to be accomplished at steps 605, 607 and 611. In one preferred embodiment of the invention, this set of design rules is entered into the program as a table. Such a table is shown in FIG. 8.

In this table 800, the names of the specific design rule parameters 808-826 are entered into column 829. Similarly, the design rule names 801-803 are entered into row 830. (Similarly, default rules may also be established, for example default rules 804-806 in table 807.) The specific design rule limits are then entered into array 827. By way of example, coefficient 828 indicates that the minimum spacing between surface mount components to meet the S2 design rule is 1.5 mm. The computer program of the invention reads this table 800 (as well as table 807 where used) stores the data in memory as the standard design rules.

The program of the invention then reads the various design rules imported at step 601 and compares them to the standard design ruled imported in the preceding paragraph. Just as there can be many different design rules, within a specific design rule, e.g. minimum spacing, there can be different types of the same rule. For discussion purposes, two such rules have been illustrated in the method of FIG. 6.

The first type of design rule, continuing the illustrative application of schematic capture and PCB design, is a "Net Rule". A Net Rule is a design rule that applies to every other net in the circuit. In other words, if a net A is supposed to be at least 2 mm away from everything else on the board, a Net Rule of 2 mm would be associated with net A.

The second type of design rule, again continuing with the schematic capture and PCB design example, is a "Conditional Rule". If net A could be close to some things, yet had to remain at least 1.5 mm from net B, a conditional rule, relative to net B, would be assigned to net A. (Note that these types of rules may be given a priority. For example, in one preferred embodiment the conditional rule takes priority over any net rule, and either the net rule or the conditional rule takes priority over the default rule of the overall schematic.)

With that understanding of the different types of design rules, the program proceeds to step 606 where the program examines the design rules imported at step 601 to determine if there is a Net Rule associated with each net. If there is, the program proceeds to step 607, where the particular Net Rule is compared to the standard design rule set (table 807 in FIG. 8). After comparing, the program enters the results of the comparison into the Design Rule Matrix with either a match or mismatch coefficient. In the case of a mismatch, the details of the mismatch are entered into the Rule Import graphic.

By way of example, suppose that the Net Rule associated in the schematic between tracks of net GND and all other nets tracks was 0.25 mm. The program compares this to the standard design rule sets (shown in table 807 in FIG. 8). Since the track to track standard rule of 0.25 mm is the "S1" variation, the program would check that all other parameters of the "S1"

rule match. If a match is found, the program populates the Design Rule Matrix with a "S1" coefficient across the GND row (708 of FIG. 7) at step 608. Since column 701 and row 702 are the same in this example, the program also populates the GND column (704 of FIG. 7) with an "S1". (Note that the GND vs. GND coefficient may be left blank, since it does not make sense for an element to have a minimum spacing from itself.) Now, if the engineer assigning design rules to the schematic had accidentally entered 0.24 mm, rather than 0.25 mm for the TRACK_TO_TRACK parameter, the program would not have found a match at step 607, since there is no 0.24 mm design rule in the standard design rule set (table 807 of FIG. 8). In this case, the program would populate the Design Rule Matrix with a mismatch coefficient. An example of an appropriate mismatch coefficient might be a capitalized "M", which indicates "mismatch".

After populating the Design Rule Matrix with the mismatch coefficient, the program would then populate the Rule Import Report graphic with a statement something like, "Error in Net Rule. For net GND, parameter TRACK_TO_TRACK was 0.24 mm in schematic and should be 0.25 mm." This alert, along with the mismatch coefficient in the Design Rule Matrix on the row intersecting the GND element in the index column, would notify the engineer that there was a discrepancy between the standard design rule set and the design rule imported from the schematic. (Note as well that a blank space in the matrix may also be an indicator. For instance, if neither a net rule nor conditional rule existed for a pair of nets, there would be a blank space in the matrix, which indicates that the default rule applies.)

As noted above, there may be all sorts of variations of design rules. The example above was for a Net Rule. It is well to now examine a Conditional Rule, which is executed at steps 609-612. By way of a Conditional Rule example, suppose that the design rule associated in the schematic between track net NET1 and track net NET2 (Conditional, since it is a rule relative only to two specific nets) was 0.25 mm. This Conditional Rule would be identified at step 609. The program compares this to the standard design rule set (found in table 800 of FIG. 8) at step 611. Since the track to track standard rule of 0.25 mm is the "S1" variation, the program would check that all other parameters of the "S1" rule match. If a match is found, the program populates the Design Rule Matrix with a "S1" coefficient at the intersection of the NET1 column and NET2 row and column at step 612.

Now, again, if the engineer assigning design rules to the schematic had accidentally entered 0.2 mm, rather than 0.25 mm, the program would not have found a match at step 611, since there is no 0.2 mm design rule in the standard design rule set. In this case, the program would populate a mismatch coefficient in the Design Rule Matrix as noted above (an example of which may be seen at coefficient 707 in matrix 700 of FIG. 7). Additionally, the program would populate the Rule Import Report graphic (as a substep of step 612) with a statement something like, "Error in Rule for NET1 & NET2. For level S1, parameter TRACK_TO_TRACK was 0.2 mm in schematic and should be 0.25 mm." Such an entry may be seen at 901 in FIG. 9. This alert, along with the mismatch coefficient in the Design Rule Matrix, would notify the engineer that there was a discrepancy between the standard design rule set and the design rule imported from the schematic.

After all the Net Rules and Conditional Rules have been entered into the Design Rule Matrix and Rule Import Report, summary data, including the total number of matches and mismatches, may be included in the Rule Import Report at step 610. The results are displayed to the user at step 613.

Figure 7:
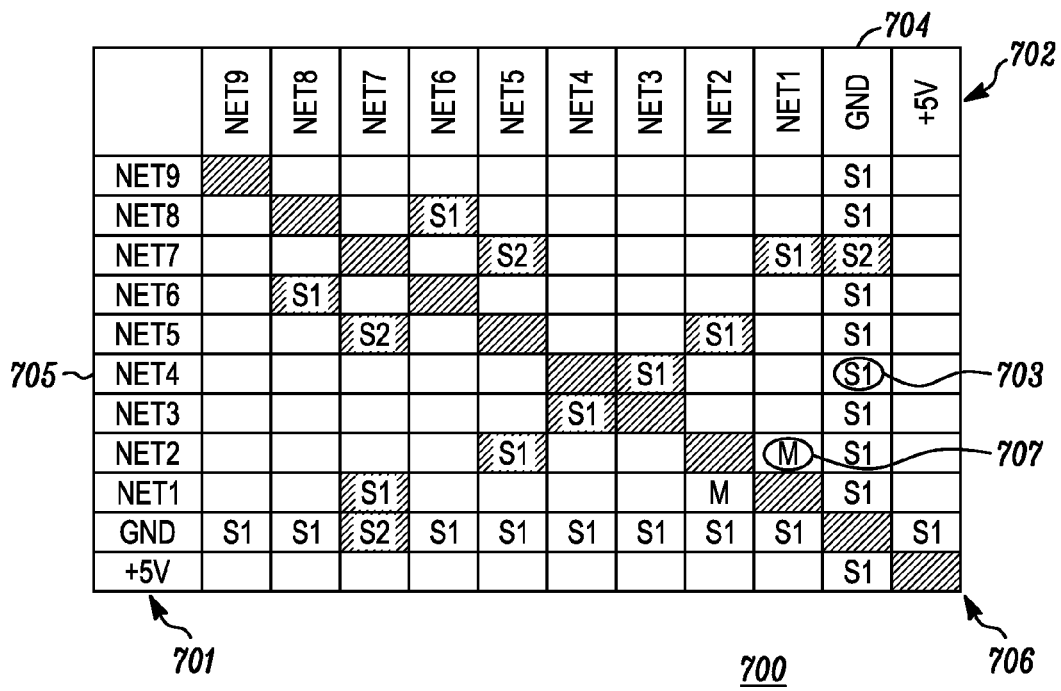
FIG. 7 illustrates one preferred embodiment of a graphical representation that provides an indication of where relational information corresponding to electronic model elements do and do not correspond to a design rule data set in accordance with the invention.

Turning now to FIG. 7, illustrated therein is one embodiment of a graphic 700 for displaying relational information between a first plurality of data elements and a second plurality of data elements in accordance with the invention. This particular graphic 700, which has been referred to herein as the Design Rule Matrix, displays a relational information coefficient $A_{i,j}$ (e.g. coefficient 703) that corresponds to an Ith data element (e.g. element 705) selected from the first plurality of data elements listed in index column 701, and the Jth data element (e.g. element 704) selected from the second plurality of data elements listed in index row 702. The coefficient $A_{i,j}$ (e.g. coefficient 703) is displayed where the row corresponding to the Ith data element and the column corresponding to the Jth data element intersect.

In the illustrative graphic 700 of FIG. 7, continuing the example above, the first plurality of data elements in index column 701 and second plurality of data elements in index row 702 are nets from an electrical schematic. In this particular embodiment, the nets in column 701 and the nets in row 702 are the same so that each net can be compared to every other net. Here, row 702 is simply a transform of column 701. A set of blank coefficients 706 is included since each net is not compared to itself.

The coefficients in the matrix 700 provide an indication to the user where the relational information of the data file, i.e. the design rules associated with the imported schematic, correspond to at least one design rule in the set of standard design rules. For example, coefficient 703 indicates that the design rule of the schematic that corresponds to the relationship between net GND 704 and net NET4 705 matches the S1 variation of the standard rule set. As such, coefficient 703 reads "S1". Where there are no rules, the coefficient is left blank, thereby providing an indication to the user that there are neither conditional rules nor net rules that apply as design rules, and thus the default design rule in the computer aided design system prevails. Had a mismatch coefficient, for instance the letter "M" appeared in the matrix (as in coefficient 707), this would have indicated to the user that the design rule associated with the schematic failed to correspond to any of the design rules in the standard design rule set.

Where there is not a match, the user needs an easy way of knowing why the mismatch occurred. This is done with both a mismatch coefficient in the Design Rule Matrix, as noted above, and with the Rule Import report graphic 900 illustrated in FIG. 9. Turning now to FIG. 9, illustrated therein is one exemplary embodiment of such a report.

To summarize, the invention includes software for checking design rules associated with an electronic model, like a schematic or other design model in a computer aided design environment. The software includes code capable of operation on a computer, wherein the code is capable of executing steps to create a graphical display to a user to allow them to quickly and efficiently compare the design rules to a set of standard rules.

The software first imports an electronic model data set. The electronic model data set, which may be a textual listing of design rules, includes at least a plurality of model elements, like nets in a schematic and relational information corresponding thereto. After importing this electronic model data set, the software then imports a standard design rule data set for comparison. A "model to standard" comparison of the relational information corresponding to the plurality of model elements with a plurality of relational rules in the design rule data set then occurs. Once this comparison is complete, the software presents a graphical display that provides an indication where the relational information corresponding to the model elements corresponds to, or matches, at least one of the plurality of relational rules in the design rule data set.

In one preferred embodiment, the graphical display comprises a matrix. An index column of the matrix may list model elements, while an index row may list the same, or different, model elements. A coefficient, $A_{i,j}$, which corresponds to an Ith model element selected from the index column, and a Jth model element selected from the index row, may indicate where the relational rule between the Ith element and Jth element match. Such a coefficient would be displayed where a column corresponding to the Ith model element and a row corresponding to the Jth model element intersect.

A suitable application for the software and method of the present invention is where the model elements correspond to an electrical circuit schematic. For example, one type of relational information that may be analyzed is where the design rule data set comprises a set of spacing rules. In addition to highlighting matching relational rules in the matrix, the software may additionally include code capable of executing the step of providing a second indication where the relational information does not correspond to the model elements corresponds to at least one of the plurality of relational rules in the design rule data set.

While the preferred embodiments of the invention have been illustrated and described, it is clear that the invention is not so limited. Numerous modifications, changes, variations, substitutions, and equivalents will occur to those skilled in the art without departing from the spirit and scope of the present invention as defined by the following claims.

What is claimed is:

1. A method for displaying relational information between a first plurality of data elements and a second plurality of data elements, the method comprising the steps of:
   a. displaying a matrix grid;
   b. displaying the first plurality of data elements in at least one column of the matrix grid;
   c. displaying the second plurality of data elements in at least one row of the matrix grid;
   d. displaying relational information coefficient $A_{i,j}$ corresponding to an Ith data element selected from the first plurality of data elements and a Jth data element selected from the second plurality of data elements, wherein the relational information coefficient $A_{i,j}$ is displayed where a row corresponding to the Ith data element and a column corresponding to the Jth data element intersect;
   e. providing a first indication to a user where the relational information corresponds to at least one design rule in the set of design rules; and
   f. providing a second indication to the user when the relational information does not correspond to at least one design rule in the set of design rules.

2. The method of claim 1, wherein the first plurality of data elements and the second plurality of data elements comprise nets in an electrical circuit.

3. The method of claim 1, wherein the relational information coefficients comprise spatial design rules.

4. The method of claim 1, wherein the method is executed by software running on a computer.

5. The method of claim 1, further comprising the steps of:
   a. reading a data file from a schematic capture software program, the data file comprising at least a list of nets and relational information corresponding thereto;
   b. reading a set of design rules;
   c. comparing the set of design rules to the relational information in the data file.

6. The method of claim 5, further comprising the step of providing the user the listing of nets where the relational information corresponding to that net does not match at least one design rule in the set of design rules.

7. The method of claim 5, wherein the set of design rules comprises a table of geometric spacing distances.

8. The method of claim 1, wherein the first plurality of data elements and the second plurality of data elements are the same.

9. The method of claim 1, wherein the second indication indicates to which design rule from the set of design rules the relational information corresponds.

10. A method for checking design rules associated with an electronic model, the method comprising code capable of operation on a computer, the code capable of executing the following steps:
    a. importing a electronic model data set, the electronic model data set comprising at least a plurality of model elements and relational information corresponding thereto;
    b. importing a design rule data set;
    c. comparing the relational information corresponding to the plurality of model elements with a plurality of relational rules in the design rule data set;
    d. presenting a graphical display;
    wherein the graphical display provides a first indication where the relational information corresponding to the model elements corresponds to at least one of the plurality of relational rules in the design rule data set and
    e. providing a second indication where the relational information does not correspond to the model elements corresponds to at least one of the plurality of relational rules in the design rule data set.

11. The method of claim 10, wherein the graphical display comprises a matrix.

12. The method of claim 11, wherein at least one column of the matrix comprises a listing of the plurality of model elements.

13. The method of claim 11, wherein at least one row of the matrix comprises a listing of the plurality of model elements.

14. The method of claim 10, wherein the first indication comprises a coefficient $A_{i,j}$ of the matrix, wherein coefficient $A_{i,j}$ corresponds to an Ith model element selected from the at least one column, and a Jth model element selected from the at least one row.

15. The method of claim 14, wherein the coefficient $A_{i,j}$ is displayed where a column corresponding to the Ith model element and a row corresponding to the Jth model element intersect.

16. The method of claim 15, wherein the model elements correspond to an electrical circuit schematic.

17. The method of claim 10, wherein the design rule data set comprises a set of spacing rules.

\* \* \* \* \*